US008853691B2

(12) United States Patent
Yang et al.

(10) Patent No.: US 8,853,691 B2
(45) Date of Patent: Oct. 7, 2014

(54) TRANSISTOR AND MANUFACTURING METHOD THEREOF (71) Applicant: E Ink Holdings Inc., Hsinchu (TW)

(72) Inventors: Chih-Hsiang Yang, Hsinchu (TW);
Ted-Hong Shinn, Hsinchu (TV);
Wei-Tsung Chen, Hsinchu (TW);
Hsing-Yi Wu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/830,972

(22) Filed: Mar. 14, 2013

(65) Prior Publication Data

US 2014/0008646 A1    Jan. 9, 2014

(30) Foreign Application Priority Data

Jul. 4, 2012   (TW) .............. 101124055 A (51) Int. Cl.
H01L 29/10    (2006.01)
H01L 29/12    (2006.01)
H01L 27/14    (2006.01)
H01L 29/66    (2006.01)
H01L 21/00    (2006.01)
H01L 29/26    (2006.01)
H01L 29/786   (2006.01)
H01L 29/78    (2006.01)

(52) U.S. Cl.
CPC .......... H01L 29/26 (2013.01); H01L 29/78696 (2013.01); H01L 29/7869 (2013.01); H01L 29/78648 (2013.01); H01L 29/78 (2013.01); H01L 29/78606 (2013.01); H01L 29/66742 (2013.01); H01L 29/66477 (2013.01)
USPC ................ 257/43; 257/59; 257/72; 257/287;
257/E21.411; 257/E29.273; 257/E29.275;
257/E29.117; 438/104; 438/149; 438/157

(58) Field of Classification Search
CPC ..................... H01L 29/7869; H01L 29/78693;
H01L 29/78696; H01L 29/78648; H01L
27/1203; H01L 27/1251
USPC ........ 257/43, 59, 72, 287, 315, 368, E21.411,
257/E29.273, E29.275, E29.117; 438/104,
438/149, 157
See application file for complete search history.

(56) References Cited

U.S. PATENT DOCUMENTS 5,567,959 A * 10/1996 Mineji ............................ 257/69
5,793,072 A *  8/1998 Kuo .............................. 257/241
5,909,615 A *  6/1999 Kuo .............................. 438/157
6,146,927 A * 11/2000 Yamanaka .................... 438/149

(Continued)

Primary Examiner — Mary Wilczewski
Assistant Examiner — Erik T Peterson
(74) Attorney, Agent, or Firm — Jianq Chyun IP Office (57) ABSTRACT A transistor and a manufacturing method thereof are provided. The transistor includes a first gate, a second gate disposed on one side of the first gate, a first semiconductor layer, a second semiconductor layer, an oxide layer, a first insulation layer, a second insulation layer, a source, and a drain. The first semiconductor layer is disposed between the first and second gates; the second semiconductor layer is disposed between the first semiconductor layer and the second gate. The oxide layer is disposed between the first semiconductor layer and the second semiconductor layer. The first insulation layer is disposed between the first gate and the first semiconductor layer; the second insulation layer is disposed between the second gate and the second semiconductor layer. The source and the drain are disposed between the first insulation layer and the second insulation layer and respectively disposed on opposite sides of the oxide layer.

17 Claims, 7 Drawing Sheets

(56) References Cited

U.S. PATENT DOCUMENTS

| | | | |
|---|---|---|---|
| 6,727,522 B1* | 4/2004 | Kawasaki et al. | 257/103 |
| 6,838,308 B2* | 1/2005 | Haga | 438/104 |
| 7,977,675 B2* | 7/2011 | Kawamura et al. | 257/43 |
| 2002/0175328 A1* | 11/2002 | Tsunoda et al. | 257/59 |
| 2003/0141504 A1* | 7/2003 | Kuwabara et al. | 257/66 |
| 2004/0056253 A1* | 3/2004 | Honda | 257/72 |
| 2005/0199959 A1* | 9/2005 | Chiang et al. | 257/368 |
| 2010/0149864 A1* | 6/2010 | Ertosun et al. | 365/174 |
| 2010/0187602 A1 | 7/2010 | Woolsey et al. | |
| 2011/0233537 A1* | 9/2011 | Shu et al. | 257/43 |
| 2011/0248354 A1 | 10/2011 | Xiao et al. | |
| 2012/0012840 A1* | 1/2012 | Korthuis et al. | 257/43 |
| 2012/0146003 A1* | 6/2012 | Chang et al. | 257/40 |
| 2012/0146713 A1* | 6/2012 | Kim et al. | 327/530 |
| 2012/0153277 A1* | 6/2012 | Yaginuma et al. | 257/43 |

* cited by examiner

TRANSISTOR AND MANUFACTURING METHOD THEREOF

CROSS-REFERENCE TO RELATED APPLICATION

This application claims the priority benefit of Taiwan application serial no. 101124055, filed on Jul. 4, 2012. The entirety of the above-mentioned patent application is hereby incorporated by reference herein and made a part of this specification.

BACKGROUND OF THE INVENTION

1. Field of Invention

The invention relates to an electronic device and a manufacturing method thereof, and more particularly, to a transistor and a manufacturing method thereof.

2. Background of the Invention

In the existing transistor, a semiconductor layer is often made of an amorphous metal oxide semiconductor material in replacement of an amorphous silicon material, so as to form the so-called metal oxide transistor. For instance, a conventional metal oxide transistor has favorable carrier mobility and operating stability in comparison with the amorphous silicon transistor, and relevant processes of manufacturing the conventional metal oxide transistor may be performed under room temperature. Hence, the metal oxide transistor has become one of the research and development topics in the industry.

In the process of designing the metal oxide transistor, the way to maintain a ratio of oxygen to other chemical elements in the semiconductor layer is one of the major issues to be resolved at present. During the manufacturing process of the transistor, oxygen in the semiconductor layer may disappear due to vapor deposition, etching, and so on, which further results in the reduction of the driving capability of the transistor. Namely, if it is likely to maintain the oxygen concentration of the semiconductor layer, performance of the metal oxide transistor is not deteriorated in the manufacturing process. Besides, the photosensitivity of the metal oxide material may affect the electrical properties and the reliability of the metal oxide transistor. Said two issues are challenges faced by a number of manufacturers during fabrication of the metal oxide transistor.

SUMMARY OF THE INVENTION

The invention is directed to a transistor having relatively satisfactory electrical performance.

The invention is further directed to a manufacturing method of a transistor. By applying the manufacturing method, the resultant transistor may have relatively satisfactory electrical performance.

In an embodiment of the invention, a transistor that includes a first gate, a second gate, a first semiconductor layer, a second semiconductor layer, an oxide layer, a first insulation layer, a second insulation layer, a source, and a drain is provided. The second gate is disposed on one side of the first gate. The first semiconductor layer is disposed between the first gate and the second gate; the second semiconductor layer is disposed between the first semiconductor layer and the second gate. The oxide layer is disposed between the first semiconductor layer and the second semiconductor layer. The first insulation layer is disposed between the first gate and the first semiconductor layer; the second insulation layer is disposed between the second gate and the second semiconductor layer. The source is disposed between the first insulation layer and the second insulation layer, and so is the drain. Besides, the source and the drain are respectively disposed on two opposite sides of the oxide layer.

In an embodiment of the invention, a manufacturing method of a transistor is provided, and the manufacturing method includes following steps. A first gate is formed on a substrate. A first insulation layer is formed on the first gate, and the first insulation layer covers the first gate. A first semiconductor layer is formed on the first insulation layer. A source and a drain are respectively formed on two opposite ends of the first semiconductor layer. An oxide layer is formed on the first semiconductor layer, and the oxide layer is located between the source and the drain. A second semiconductor layer is formed on the oxide layer, and two opposite ends of the second semiconductor layer are respectively connected to the source and the drain. A second insulation layer is formed on the second semiconductor layer. A second gate is formed on the second insulation layer.

In view of the above, according to an embodiment of the invention, the transistor is equipped with the first semiconductor layer and the second semiconductor layer, and the oxide layer is located between the two semiconductor layers for repairing the semiconductor layers, improving the driving capability of the transistor, and raising a current on-off ratio of the transistor.

Several exemplary embodiments accompanied with figures are described in detail below to further explain the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EXEMPLARY EMBODIMENTS

In an exemplary embodiment of the invention, the transistor has an oxide layer located between two semiconductor layers, and the oxygen concentration of the oxide layer is greater than the oxygen concentration of the semiconductor layers. Thereby, a repair interface may be formed between the oxide layer and the semiconductor layers due to diffusion of oxygen, so as to repair the semiconductor layers.

Figure 1A:
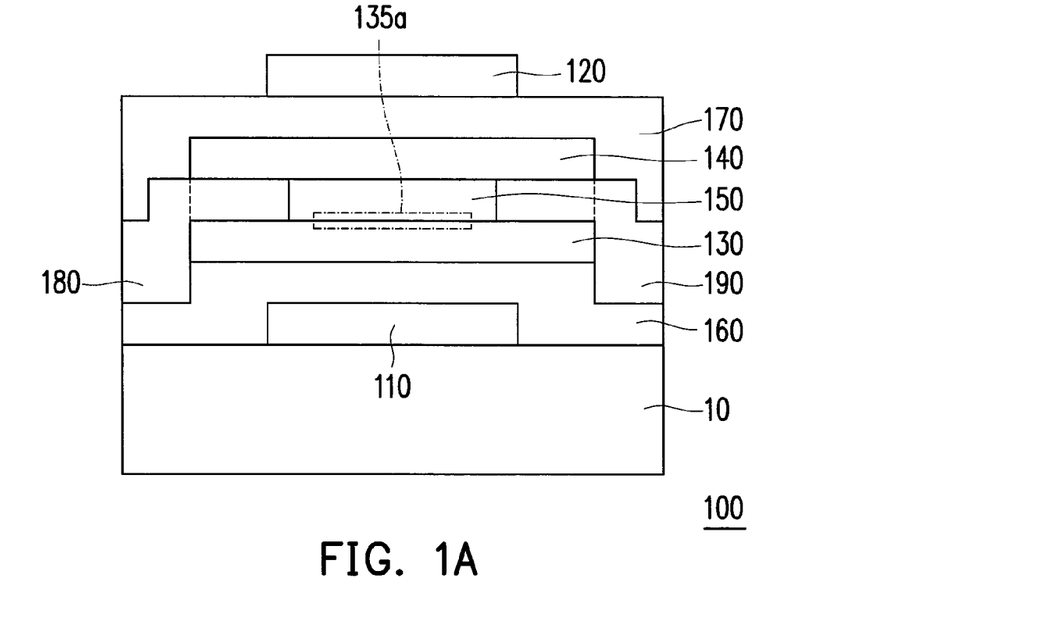
FIG. 1A is a schematic cross-sectional view illustrating a transistor according to an embodiment of the invention.
Figure 1B:
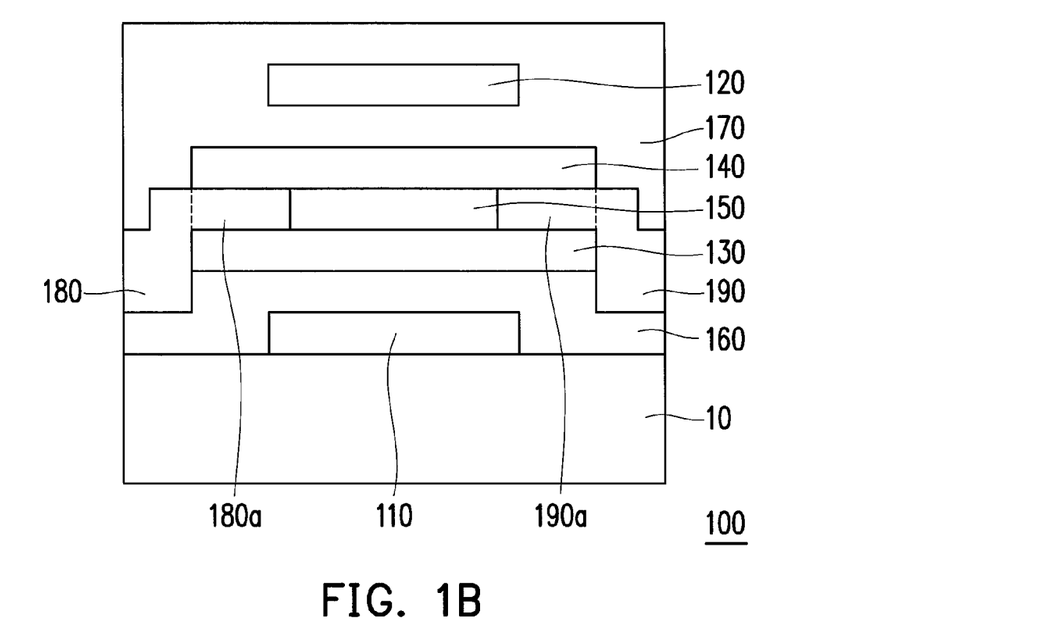
FIG. 1B is a schematic cross-sectional view illustrating a transistor according to another embodiment of the invention.

FIG. 1A is a schematic cross-sectional view illustrating a transistor according to an embodiment of the invention. With reference to FIG. 1A, the transistor 100 includes a first gate 110, a second gate 120, a first semiconductor layer 130, a second semiconductor layer 140, an oxide layer 150, a first insulation layer 160, a second insulation layer 170, a source 180, and a drain 190. As to the detailed structure of the transistor 100, the second gate 120 is disposed on one side of the first gate 110. The first semiconductor layer 130 is disposed between the first gate 110 and the second gate 120; the second semiconductor layer 140 is disposed between the first semiconductor layer 130 and the second gate 120. The oxide layer 150 is disposed between the first semiconductor layer 130 and the second semiconductor layer 140. The first insulation layer 160 is disposed between the first gate 110 and the first semiconductor layer 130; the second insulation layer 170 is disposed between the second gate 120 and the second semiconductor layer 140. Besides, the transistor 100 includes the source 180 and the drain 190 that are disposed between the first insulation layer 160 and the second insulation layer 170. In the stacked structure of the transistor 100, the source 180 and the drain 190 are respectively disposed on two opposite sides of the oxide layer 150. The stacked structure of the transistor 100 may be located on a substrate 10, and the substrate 10 may be made of glass, plastic, or any other appropriate material. FIG. 1B is a schematic cross-sectional view illustrating a transistor according to another embodiment of the invention. As illustrated in FIG. 1B, the second insulation layer 170 may further cover the second gate 120 to protect the second gate 120.

According to the previous embodiment, the transistor 100 has two gates, two semiconductor layers, and one pair of source and drain and thus may be considered as a transistor with two channels for carriers to move. Hence, in the transistor 100, at least one portion of the source is disposed between the first semiconductor layer 130 and the second semiconductor layer 140, and at least one portion of the drain is disposed between the first semiconductor layer 130 and the second semiconductor layer 140. A material of the first semiconductor layer 130 and the second semiconductor layer 140 is a metal oxide semiconductor material that includes zinc oxide (ZnO), indium-gallium-zinc oxide (IGZO), gallium-zinc oxide (GZO), zinc-tin oxide (ZTO), indium-zinc oxide (IZO), or any combination thereof. A material of the oxide layer 150 is an insulation material in this embodiment, while the oxide layer 150 may be made of metal oxide, non-metal oxide, or any combination thereof in other embodiments. In addition, a material of the oxide layer 150 may be metal oxide which is not apt to cause oxygen vacancy, such as silicon oxide, hafnium dioxide, titanium oxide, $Ga_2O_3$, or a combination thereof.

As indicated in FIG. 1A, in the transistor 100 described in the previous embodiment, the oxygen concentration of the oxide layer 150 is greater than the oxygen concentration of the first semiconductor layer 130. Since the oxygen concentration of the oxide layer 150 is higher than that of the first semiconductor layer 130, when the oxide layer 150 is in contact with the first semiconductor layer 130, a repair interface 135a is formed between the oxide layer 150 and the first semiconductor layer 130 due to diffusion of oxygen. On account of the difference in the oxygen concentration between the oxide layer 150 and the first semiconductor layer 130, oxygen is diffused and enters the first semiconductor layer 130 from the oxide layer 150, so as to replenish the lost oxygen in the first semiconductor layer 130 and maintain the oxygen concentration of the first semiconductor layer 130. Moreover, the driving capability of the transistor 100 may be enhanced. In particular, when a molar percentage of oxygen of the oxide layer 150 to all elements in the oxide layer 150 is greater than a molar percentage of oxygen of the first semiconductor layer 130 to all the elements in the semiconductor layer 130, the oxygen of the oxide layer 150 is diffused and enters the first semiconductor layer 130, so as to replenish the lost oxygen in the first semiconductor layer 130.

Additionally, through selecting the material of the oxide layer 150, the oxide layer 150 may be conducive to replenishment of other insufficient elements in the first semiconductor layer 130. For instance, it is assumed that the oxide layer 150 is made of a metal oxide material, and the oxide layer 150 and the first semiconductor layer 130 have a same metal element. When the concentration of the metal element of the oxide layer 150 is greater than that of the first semiconductor layer 130, the difference in the concentration of the metal element between the oxide layer 150 and the first semiconductor layer 130 may lead to the diffusion of the metal element from the oxide layer 150 to the first semiconductor layer 130, and thereby the performance of the transistor 100 may be maintained or even improved. In addition to the above, the electrical properties of the transistor 100 may be ameliorated through selecting the material of the oxide layer 150 and changing the percentage of components in the semiconductor layer.

According to another embodiment of the invention, the oxygen concentration of the oxide layer 150 is greater than the oxygen concentration of the second semiconductor layer 140. Therefore, when the oxide layer 150 is in contact with the second semiconductor layer 140, another repair interface (not shown) is formed between the oxide layer 150 and the second semiconductor layer 140 due to diffusion of oxygen. On account of the difference in the oxygen concentration between the oxide layer 150 and the second semiconductor layer 140, oxygen is diffused and enters the second semiconductor layer 140 from the oxide layer 150, so as to replenish the lost oxygen in the second semiconductor layer 140 and maintain the oxygen concentration of the second semiconductor layer 140. This is similar to the replenishment of oxygen in the first semiconductor layer 130 as described above. Namely, two different repair interfaces may be respectively formed between the oxide layer 150 and the first semiconductor layer 130 and between the oxide layer 150 and the second semiconductor layer 140. In the event that the oxygen concentration of the oxide layer 150 is greater than both the oxygen concentration of the first semiconductor layer 130 and the oxygen concentration of the second semiconductor layer 140, the oxide layer 150 is capable of simultaneously replenishing the lost oxygen in the first and second semiconductor layers 130 and 140 and maintaining the oxygen concentration of these two semiconductor layers 130 and 140.

The first and second gates 110 and 120 are made of a metal material, and the gates made of metal may preclude the direct impact of external light on the semiconductor layers. Thereby, notwithstanding the photosensitivity of the metal oxide semiconductor, the electrical properties and the reliability of the transistor are not negatively affected.

In an embodiment of the invention, the transistor 100 has two gates (i.e., the first and second gates 110 and 120), two metal oxide semiconductor channels (the first and second semiconductor layers 130 and 140), and only one pair of source 180 and drain 190. Accordingly, the transistor 100 may be employed in the same manner as connecting two single-gate single-channel transistors in parallel.

Figure 2:
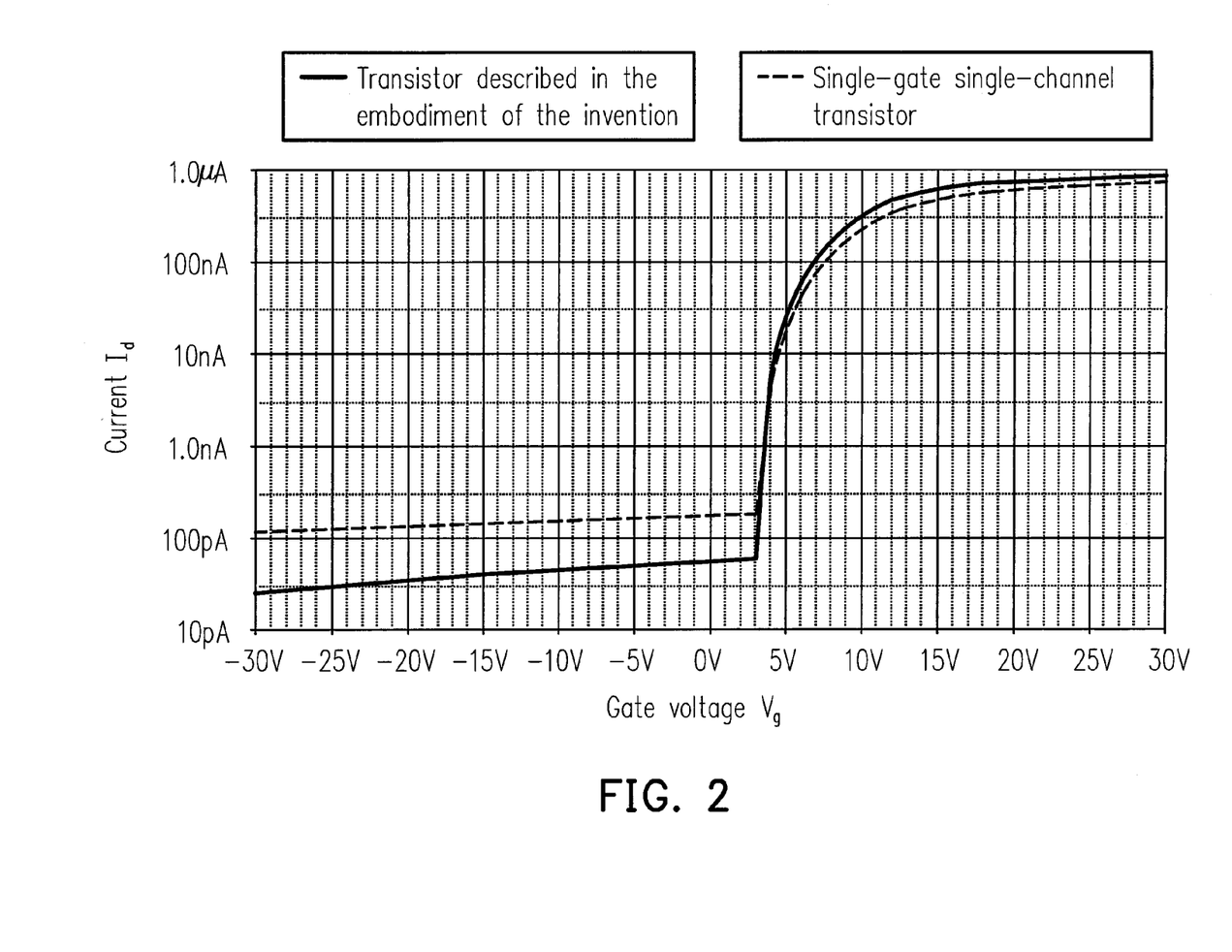
FIG. 2 is a diagram showing the comparison between a circuit waveform of a transistor described in an embodiment of the invention and a circuit waveform of a normal single-gate, single-channel transistor.

Compared to the normal single-gate single-channel transistor, the transistor 100 described herein has more on-channels, and the current on-off ratio of the transistor 100 may be raised by controlling the two gates of the transistor 100. FIG. 2 is a diagram showing the comparison between a circuit waveform of a transistor described in an embodiment of the invention and a circuit waveform of a normal single-gate, single-channel transistor. As shown in FIG. 2, the gate voltage $V_g$ of the transistor 100 described herein and the normal single-gate single-channel transistor is controlled, and the current $I_d$ flowing through the source-drain channel of the transistors is detected. Consequently, the current on-off ratio of the transistor 100 described herein is higher than that of the normal transistor. As to the current leakage, the difference in the oxygen concentration between the oxide layer 150 and the first semiconductor layer 130 results in the diffusion of oxygen from the oxide layer 150 to the first semiconductor layer 130, so as to replenish the lost oxygen in the first semiconductor layer 130 and maintain the oxygen concentration of the first semiconductor layer 130. As such, the current leakage of the first semiconductor layer 130 may be reduced, the electrical properties and the reliability of the transistor 100 are not negatively affected, and unnecessary power consumption may be avoided.

Figure 3A:
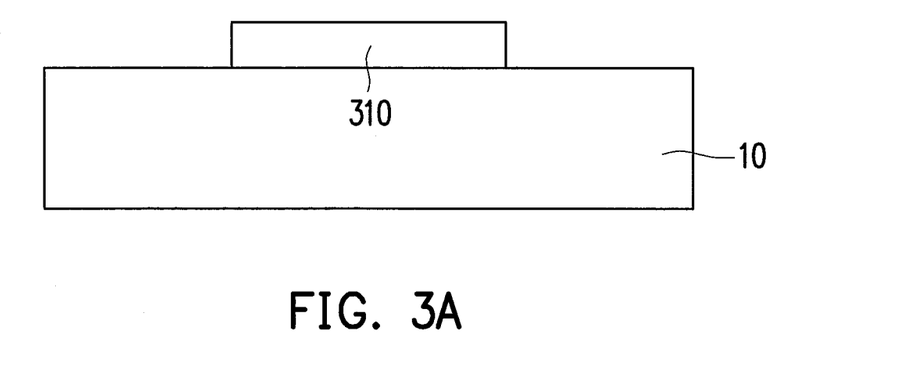
FIG. 3A through FIG. 3I illustrate a manufacturing method of a transistor according to an embodiment of the invention.
Figure 3B:
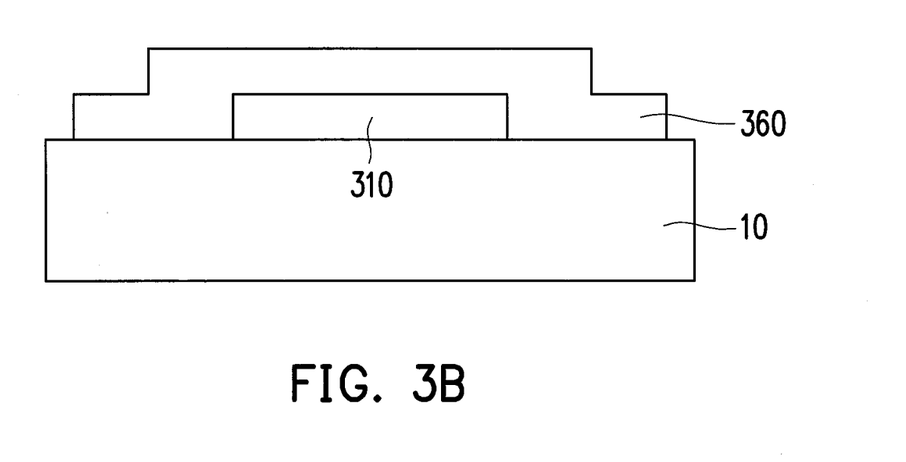
Figure 3C:
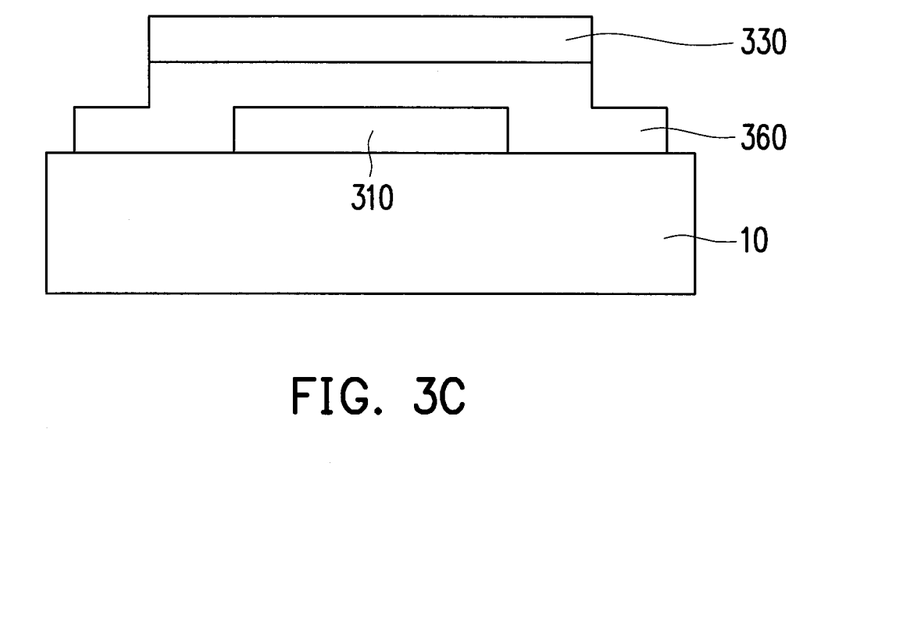

FIG. 3A through FIG. 3I illustrate a manufacturing method of a transistor according to an embodiment of the invention. With reference to FIG. 3A, a first gate 310 is formed on a substrate 10, and the first gate 310 is an electrode made of a metal material. As shown in FIG. 3B, a first insulation layer 360 is formed on the first gate 310, and the first insulation layer 360 covers the first gate 310, so as to protect the first gate 310 and separate the gate electrode from other electrodes. With reference to FIG. 3C, a metal oxide semiconductor material is deposited onto the first insulation layer 360 to form the first semiconductor layer 330. A source and a drain are then respectively formed on two opposite ends of the first semiconductor layer 330.

Figure 3D:
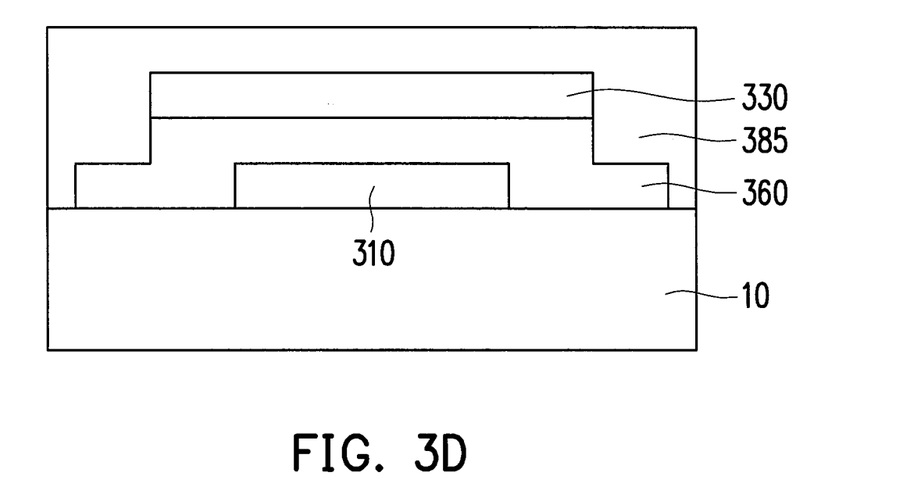
Figure 3E:
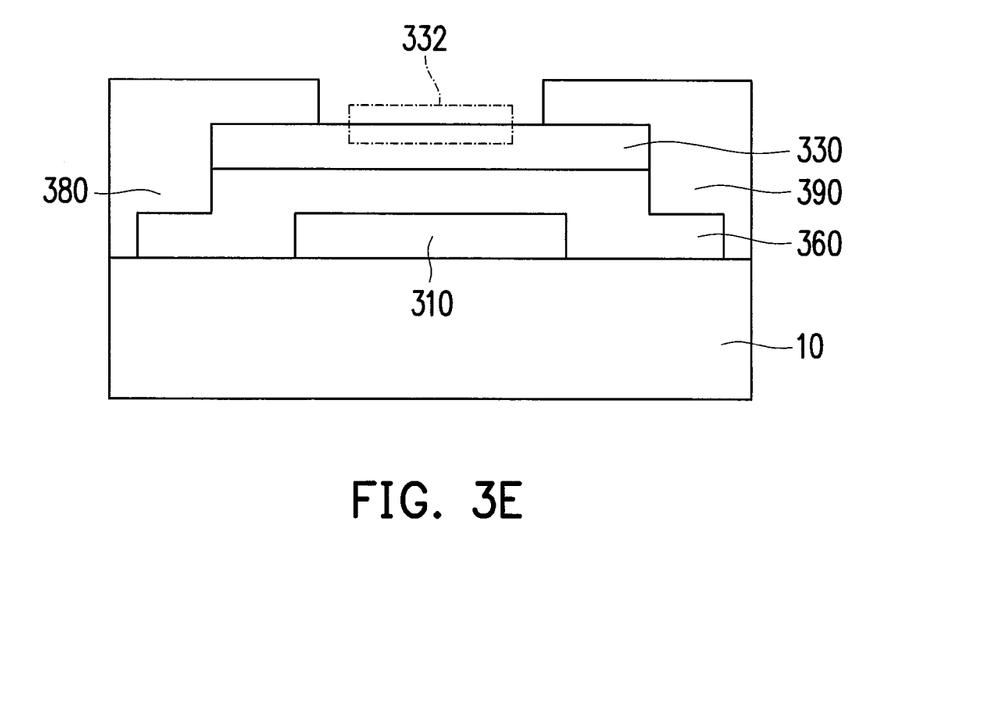
Figure 3F:
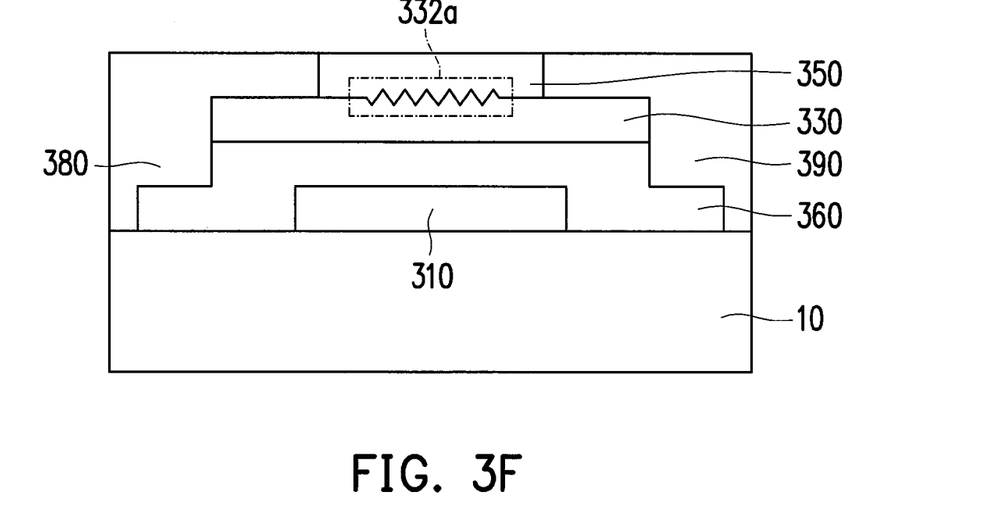

To comply with the manufacturing requirements and facilitate the manufacturing process, in the step of forming the source and the drain, as shown in FIG. 3D, a conductive layer 385 is formed on the first semiconductor layer 330. The conductive layer 385 is made of a metal material in this embodiment, which should not be construed as a limitation to the invention. In FIG. 3E, after the conductive layer 385 is formed, one portion of the conductive layer 385 is etched, such that the other portion of the conductive layer 385 forms the source 380 and the drain 390 separated from each other. After the portion of the conductive layer 385 is completely etched, a top portion 332 of the first semiconductor layer 330 located below the etched portion of the conductive layer 385 is continuously etched. An oxide layer 350 is then formed on the first semiconductor layer 330, as shown in FIG. 3F, and the oxide layer 350 is located between the source 380 and the drain 390. In the process of forming the oxide layer 350, the oxide layer 350 is deposited (sputtered) onto an etch surface 332a formed by etching the top portion 332 of the first semiconductor layer 330, and oxygen in the oxide layer 350 is diffused to the etch surface 332a, so as to repair the etch surface 332a.

Figure 3G:
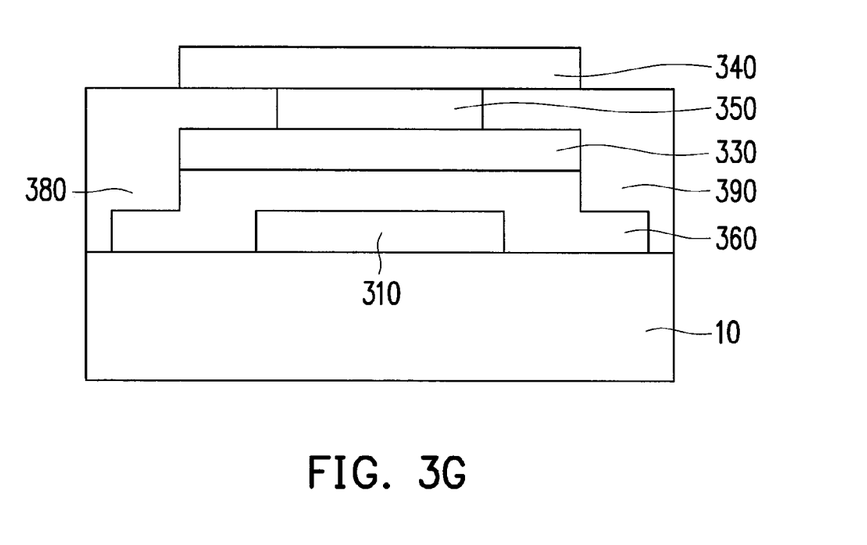
Figure 3H:
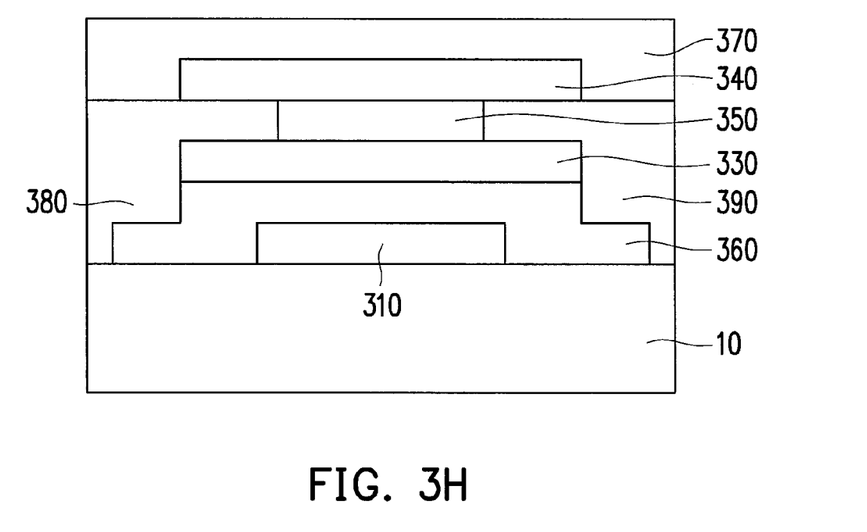
Figure 3I:
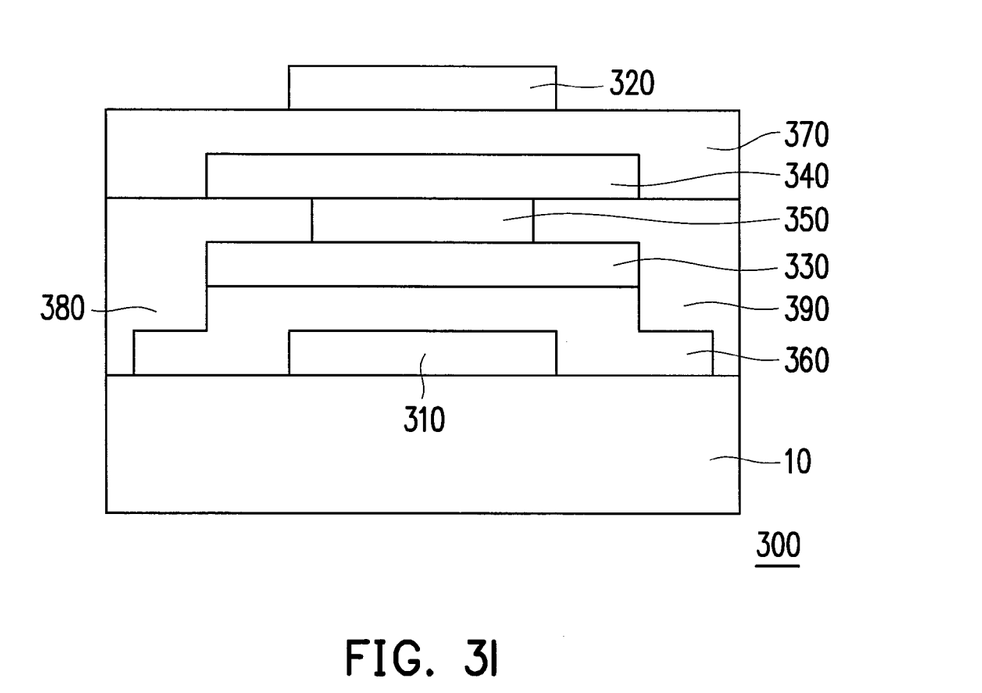

With reference to FIG. 3G, a second semiconductor layer 340 is formed on the oxide layer 350, and two opposite ends of the second semiconductor layer 340 are respectively connected to the source 380 and the drain 390. That is, in the above-mentioned process, at least one portion of the source 380 and at least one portion of the drain 390 are located between the first and second semiconductor layers 330 and 340. In FIG. 3H, a second insulation layer 370 is formed on the second semiconductor layer 340; in FIG. 3I, a second gate 320 is formed on the second insulation layer 370. The second gate 320 is made of a metal material that may preclude the direct impact of light on the metal oxide semiconductor.

According to the manufacturing method of the transistor described in the previous embodiments, when the oxide layer 350 is deposited, the repair interface is formed on the etch surface 332a due to the difference in the oxygen concentration between the oxide layer 350 and the first semiconductor layer 330. Here, the repair interface is formed to replenish the lost oxygen in the first semiconductor layer 330, and the oxygen is lost because of the etching process. The details of the manufacturing process of the transistor are sufficiently taught and suggested in the descriptions provided in the previous embodiments shown in FIG. 1A, FIG. 1B, and FIG. 2, and therefore no further descriptions are given hereinafter.

To sum up, in the embodiments of the invention, the oxide layer with relatively high oxygen concentration is sandwiched between the first and second semiconductor layers of the transistor, such that the first and second semiconductor layers with relatively low oxygen concentration may be repaired due to the difference in oxygen concentration. Moreover, the transistor described herein has two gates and two channels, and the material of the oxide layer may be selected based on actual requirements of the semiconductor layers. Accordingly, the inherent defects of the semiconductor layers or the defects of the semiconductor layers occurring in the manufacturing process may be overcome.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A transistor comprising:
a first gate;
a second gate disposed on one side of the first gate;
a first semiconductor layer disposed between the first gate and the second gate;
a second semiconductor layer disposed between the first semiconductor layer and the second gate;
an oxide layer disposed between the first semiconductor layer and the second semiconductor layer;
a first insulation layer disposed between the first gate and the first semiconductor layer;
a second insulation layer disposed between the second gate and the second semiconductor layer;
a source disposed between the first insulation layer and the second insulation layer; and
a drain disposed between the first insulation layer and the second insulation layer, the source and the drain being respectively disposed on two opposite sides of the oxide layer,
wherein a material of the first semiconductor layer and the second semiconductor layer is a metal oxide semiconductor material,
wherein oxygen concentration of the oxide layer is greater than oxygen concentration of the first semiconductor layer,
wherein the oxide layer is in contact with the first semiconductor layer, so as to form a repair interface between the oxide layer and the first semiconductor layer due to diffusion of oxygen, and thus replenishing lost oxygen in the first semiconductor layer and maintaining the oxygen concentration of the first semiconductor layer.

2. The transistor as recited in claim 1, wherein at least one portion of the source is disposed between the first semiconductor layer and the second semiconductor layer, and at least one portion of the drain is disposed between the first semiconductor layer and the second semiconductor layer.

3. The transistor as recited in claim 1, wherein the material of the first semiconductor layer and the second semiconductor layer comprises zinc oxide, indium-gallium-zinc oxide, gallium-zinc oxide, zinc-tin oxide, indium-zinc oxide, or a combination thereof.

4. The transistor as recited in claim 1, wherein a material of the oxide layer is an insulation material.

5. The transistor as recited in claim 1, wherein a material of the oxide layer comprises metal oxide, non-metal oxide, or a combination thereof.

6. The transistor as recited in claim 1, wherein a material of the oxide layer comprises silicon oxide, hafnium dioxide, titanium oxide, Ga2O3, or a combination thereof.

7. The transistor as recited in claim 1, wherein a molar percentage of oxygen of the oxide layer to all elements in the oxide layer is greater than a molar percentage of oxygen of the first semiconductor layer to all the elements in the first semiconductor layer.

8. A manufacturing method of a transistor, comprising:
forming a first gate on a substrate;
forming a first insulation layer on the first gate, the first sulation layer covering the first gate;
forming a first semiconductor layer on the first insulation layer;
forming a source and a drain respectively on two opposite ends of the first semiconductor layer;
forming an oxide layer on the first semiconductor layer, the oxide layer being located between the source and the drain;
forming a second semiconductor layer on the oxide layer, two opposite ends of the second semiconductor layer being respectively connected to the source and the drain;
forming a second insulation layer on the second semiconductor layer; and
forming a second gate on the second insulation layer,
wherein a method of forming the source and the drain comprises: forming a conductive layer on the first semiconductor layer; and etching one portion of the conductive layer, such that the other portion of the conductive layer forms the source and the drain separated from each other,
wherein the method of forming the source and the drain further comprises: after etching the portion of the conductive layer, continuously etching a top portion of the first semiconductor layer located below the portion of the conductive layer, wherein a method of forming the oxide layer on the first semiconductor layer comprises depositing the oxide layer on an etch surface formed by etching the top portion of the first semiconductor layer, and repairing the etch surface by diffusing oxygen of the oxide layer to the etch surface.

9. The manufacturing method as recited in claim 8, further comprising causing at least one portion of the source to be between the first semiconductor layer and the second semiconductor layer, and causing at least one portion of the drain to be between the first semiconductor layer and the second semiconductor layer.

10. The manufacturing method as recited in claim 8, wherein a material of the first semiconductor layer and the second semiconductor layer is a metal oxide semiconductor material.

11. The manufacturing method as recited in claim 10, wherein the material of the first semiconductor layer and the second semiconductor layer comprises zinc oxide, indium-gallium-zinc oxide, gallium-zinc oxide, zinc-tin oxide, indium-zinc oxide, or a combination thereof.

12. The manufacturing method as recited in claim 8, wherein a material of the oxide layer is an insulation material.

13. The manufacturing method as recited in claim 8, wherein a material of the oxide layer comprises metal oxide, non-metal oxide, or a combination thereof.

14. The manufacturing method as recited in claim 8, wherein a material of the oxide layer comprises silicon oxide, hafnium dioxide, titanium oxide, Ga2O3, or a combination thereof.

15. The manufacturing method as recited in claim 8, wherein oxygen concentration of the oxide layer is greater than oxygen concentration of the first semiconductor layer.

16. The manufacturing method as recited in claim 15, further comprising causing the oxide layer to be in contact with the first semiconductor layer, so as to form a repair interface between the oxide layer and the first semiconductor layer due to diffusion of oxygen.

17. The manufacturing method as recited in claim 15, wherein a molar percentage of oxygen of the oxide layer to all elements in the oxide layer is greater than a molar percentage of oxygen of the first semiconductor layer to all the elements in the first semiconductor layer.

* * * * *